United States Patent
Ito et al.

(10) Patent No.: US 8,194,723 B2
(45) Date of Patent: Jun. 5, 2012

(54) TEST APPARATUS FOR 64B/66B ENCODING PROCESS

(75) Inventors: Tomohiro Ito, Atsugi (JP); Takayuki Awano, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 242 days.

(21) Appl. No.: 12/710,684

(22) Filed: Feb. 23, 2010

(65) Prior Publication Data

US 2010/0220777 A1  Sep. 2, 2010

(30) Foreign Application Priority Data

Feb. 27, 2009  (JP) ................................ 2009-045596

(51) Int. Cl.
*H04B 3/46* (2006.01)
*G06F 11/00* (2006.01)

(52) U.S. Cl. ....................... 375/224; 714/703

(58) Field of Classification Search .................. 375/224, 375/295, 354, 359, 259, 219, 221; 714/699, 714/746, 752, 712, 715, 716, 703, 30; 370/241, 370/249; 398/9, 16

See application file for complete search history.

(56) References Cited

U.S. PATENT DOCUMENTS

| 2002/0129307 A1* | 9/2002 | Walker et al. ................. 714/715 |
| 2005/0058187 A1* | 3/2005 | Groen et al. .................. 375/219 |
| 2007/0157060 A1* | 7/2007 | Ganga et al. .................. 714/752 |

OTHER PUBLICATIONS

Receive State Machine, IEEE802.3; 2005; pp. 227-246.

\* cited by examiner

*Primary Examiner* — David C. Payne
*Assistant Examiner* — Vineeta Panwalkar
(74) *Attorney, Agent, or Firm* — Greer, Burns & Crain, Ltd.

(57) ABSTRACT

The present invention provides a test apparatus for a 64B/66B encoding process capable of precisely performing a test with a high reproducibility on a certain pattern of a 64B/66B encoder or decoder. A frame generator generates frame data in a layer higher than a physical coding sublayer of Ethernet (registered trademark) and inputs the frame data to a 64B/66B encoder such that the 64B/66B encoder performs a 64B/66B encoding process of the physical coding sublayer with respect to the frame data. A sequence pattern generator generates a certain 66B sequence pattern written in advance, and a controller writes a desired sequence pattern in the sequence pattern generator and, at the same time, controls a data selector to select one of data encoded by the 64B/66B encoder and a sequence pattern output from the sequence pattern generator and to provide the selected one to a test subject.

5 Claims, 6 Drawing Sheets

FIG. 2

| Input Data | sync | Block Payload | | | | | | | |
|---|---|---|---|---|---|---|---|---|---|
| Bit Position :<br>Data<br>Block Format : | 01 | 2 | | | | | | | 65 |
| $D_0D_1D_2D_3D_4D_5D_6D_7$ | 01 | $D_0$ | $D_1$ | $D_2$ | $D_3$ | $D_4$ | $D_5$ | $D_6$ | $D_7$ |
| Control Block<br>Formats : | | Block Type<br>Field | | | | | | | |
| $C_0C_1C_2C_3/C_4C_5C_6C_7$ | 10 | 0xfe | $C_0$ | $C_1$ | $C_2$ | $C_3$ | $C_4$ | $C_5$ | $C_6$ | $C_7$ |
| $C_0C_1C_2C_3/O_4D_5D_6D_7$ | 10 | 0x2d | $C_0$ | $C_1$ | $C_2$ | $C_3$ | $O_4$ | $D_5$ | $D_6$ | $D_7$ |
| $C_0C_1C_2C_3/S_4D_5D_6D_7$ | 10 | 0x33 | $C_0$ | $C_1$ | $C_2$ | $C_3$ | | $D_5$ | $D_6$ | $D_7$ |
| $O_0D_1D_2D_3/S_4D_5D_6D_7$ | 10 | 0x66 | $D_1$ | $D_2$ | $D_3$ | $O_0$ | | $D_5$ | $D_6$ | $D_7$ |
| $O_0D_1D_2D_3/O_4D_5D_6D_7$ | 10 | 0x55 | $D_1$ | $D_2$ | $D_3$ | $O_0$ | $O_4$ | $D_5$ | $D_6$ | $D_7$ |
| $S_0D_1D_2D_3/D_4D_5D_6D_7$ | 10 | 0x78 | $D_1$ | $D_2$ | $D_3$ | $D_4$ | | $D_5$ | $D_6$ | $D_7$ |
| $O_0D_1D_2D_3/C_4C_5C_6C_7$ | 10 | 0x4b | $D_1$ | $D_2$ | $D_3$ | $O_0$ | $C_4$ | $C_5$ | $C_6$ | $C_7$ |
| $T_0C_1C_2C_3/C_4C_5C_6C_7$ | 10 | 0x37 | | $C_1$ | $C_2$ | $C_3$ | $C_4$ | $C_5$ | $C_6$ | $C_7$ |
| $D_0T_1C_2C_3/C_4C_5C_6C_7$ | 10 | 0x99 | $D_0$ | | $C_2$ | $C_3$ | $C_4$ | $C_5$ | $C_6$ | $C_7$ |
| $D_0D_1T_2C_3/C_4C_5C_6C_7$ | 10 | 0xaa | $D_0$ | $D_1$ | | $C_3$ | $C_4$ | $C_5$ | $C_6$ | $C_7$ |
| $D_0D_1D_2T_3/C_4C_5C_6C_7$ | 10 | 0xb4 | $D_0$ | $D_1$ | $D_2$ | | $C_4$ | $C_5$ | $C_6$ | $C_7$ |
| $D_0D_1D_2D_3/T_4C_5C_6C_7$ | 10 | 0xcc | $D_0$ | $D_1$ | $D_2$ | $D_3$ | | $C_5$ | $C_6$ | $C_7$ |
| $D_0D_1D_2D_3/D_4T_5C_6C_7$ | 10 | 0xd2 | $D_0$ | $D_1$ | $D_2$ | $D_3$ | $D_4$ | | $C_6$ | $C_7$ |
| $D_0D_1D_2D_3/D_4D_5T_6C_7$ | 10 | 0xe1 | $D_0$ | $D_1$ | $D_2$ | $D_3$ | $D_4$ | $D_5$ | | $C_7$ |
| $D_0D_1D_2D_3/D_4D_5D_6T_7$ | 10 | 0xff | $D_0$ | $D_1$ | $D_2$ | $D_3$ | $D_4$ | $D_5$ | $D_6$ | |

64B/66B Block Formats

S : PACKET HEAD POSITION
D : DATA CODE
C : CONTROL CODE
T : PACKET TERMINATION POSITION
O : LINK STATUS INFORMATION

FIG. 4

| No. | Cnt | SH | Pattern |
|-----|-----|----|---------|
| 001 | 0 | 01 | FFFF---------------FFFF |
| 002 | 1 | | |
| 003 | 1 | | |
| 004 | 2 | | |
| 005 | 5 | | |
| 006 | 1 | | |
| 007 | 10 | | |
| 008 | 1 | | |

66B Programable  Speed

Recall
Import
Export

FIG. 5

| No. | Rel Time(ns) | SH | Block Type | | | | | | | DATA | | | |
|---|---|---|---|---|---|---|---|---|---|---|---|---|---|
| 45 | 65740.8 | 10 | T0C1C2C3/C4C5C6C7 | 87 | N0=00 | C1=00 | C2=00 | C3=00 | C4=00 | C5=00 | C6=00 | C7=00 |
| 46 | 68480.0 | 10 | C0C1C2C3/S4D5D6D7 | 33 | C0=00 | C1=00 | C2=00 | C3=00 | N4=00 | D5=55 | D6=55 | D7=55 |
| 47 | 68825.6 | 10 | D0T1C2C3/C4C5C6C7 | 99 | D0=CB | N6=00 | C2=00 | C3=00 | C4=00 | C5=00 | C6=00 | C7=00 |
| 48 | 71564.8 | 10 | C0C1C2C3/S4D5D6D7 | 33 | C0=00 | C1=00 | C2=00 | C3=00 | N4=00 | D5=55 | D6=55 | D7=55 |
| 49 | 71910.4 | 10 | D0T1C2C3/C4C5C6C7 | AA | D0=79 | D1=77 | N5=00 | C3=00 | C4=00 | C5=55 | C6=55 | C7=55 |
|   |   |   |   |   |   |   |   |   |   |   |   |   |
|   |   |   |   |   |   |   |   |   |   |   |   |   |

TEST APPARATUS FOR 64B/66B ENCODING PROCESS

CROSS-REFERENCE TO RELATED APPLICATION

This application claims priority to and the benefit of Japanese Patent Application No. 2009-45596, filed on Feb. 27, 2009, the disclosure of which is incorporated herein by reference in its entirety.

BACKGROUND

1. Field of the Invention

The present invention relates to a technique capable of precisely performing a test with a high reproducibility on a certain pattern of a 64B/66B encoder or decoder of a 10 GBASE-R PCS (physical coding sublayer), defined in IEEE802.3, in various types of transmission apparatuses or communication apparatuses having a 10-Gigabit Ethernet (registered trademark) interface, in which B of the 64B/66B represents a bit.

2. Discussion of Related Art

The basic flow of a 64B/66B encoding sequence of a 10 GBASE-R PCS is RX-INT (initial state)→RX-C (control code process state)→RX-D (data process state)→RX-T (termination code state) as described in a non patent literature "IEEE802.3 Receive State Machine". However, in order to test a decoding sequence at a receiver side, for example, when an attempt is made to test the case in which a termination code is input to the RX-C state, the RX-C is transited to RX-E (error code process state) in a typical encoding process, and thus it is impossible to perform the test in the encoding process of data from a higher layer.

In the case where an abnormal state occurs as mentioned above, the test is performed by causing a loss of data in a physical layer such as turning on/off of an optical output and inserting an error into the physical layer.

However, the above-described method has a problem that an accurate test cannot be performed since it has a low reproducibility and an intended operation is not performed due to initialization of the apparatus.

SUMMARY OF THE INVENTION

The prevent invention has been made in an effort to solve the above-described problems associated with the prior art, and an object of the present invention is to provide a test apparatus for a 64B/66B encoding process capable of precisely performing a test with a high reproducibility on a certain pattern of a 64B/66B encoder or decoder.

According to an aspect of the invention, there is provided a test apparatus for a 64B/66B encoding process, the apparatus including: a frame generator for generating frame data in a layer higher than a physical coding sublayer of Ethernet; a 64B/66B encoder for performing a 64B/66B encoding process of the frame data in the physical coding sublayer and generating encoded 66B data; and a sequence pattern generator for generating a 66B sequence pattern; a data selector for selecting either the 66B data encoded by the 64B/66B encoder or the 66B sequence pattern output from the sequence pattern generator and providing the selected one to a test subject.

The test apparatus for a 64B/66B encoding process may further include a 66B data storage for storing 66B data, which satisfy a predetermined condition, among externally input 66B data, wherein the controller may generate the 66B sequence pattern based on the 66B data stored in the 66B data storage and write the generated 66B sequence pattern in the sequence pattern generator.

The 66B data storage may store the 66B data, which pass through a filter circuit having a predetermined pass condition, among the externally input 66B data.

The test apparatus for a 64B/66B encoding process may further include a 64B/66B decoder for decoding the externally input 66B data and detecting an error, wherein the 66B data storage may store the 66B data based on the result of the error detection performed by the 64B/66B decoder among the externally input 66B data.

The 66B data storage may determine whether or not the externally input 66B data satisfy a predetermined storage termination condition using a trigger circuit and terminate the storage of the 66B data based on the result of the determination.

According to another aspect of the invention, there is provided a test method for a 64B/66B encoding process, the method comprising: frame generating step for generating frame data in a layer higher than a physical coding sublayer of Ethernet; 64B/66B encoding step for performing a 64B/66B encoding process of the frame data in the physical coding sublayer and generating encoded 66B data; and sequence pattern generating step for generating 66B sequence pattern; data selecting step for selecting either the 66B data encoded by the 64B/66B encoding step or the 66B sequence pattern output from the sequence pattern generating step, and providing the selected one to a test subject.

As such, since the test apparatus for a 64B/66B encoding process of the present invention can generate a certain 66B sequence pattern and provide the 66B sequence pattern to a test subject, it is possible to precisely perform an intended test with a high reproducibility on a 64B/66B encoder or decoder of the test subject without turning on/off of an optical output and inserting an error into a physical layer.

Moreover, since the externally input 66B data is stored and the 66B sequence pattern used for transmission can be generated based on the 66B data, it is possible to facilitate the formation of the 66B sequence pattern, and further it is possible to simply generate a sequence pattern having 66B data with a desired condition when a storage condition is designated, thus efficiently performing the test.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 2 is a schematic diagram of a 64B/66B data structure.

FIG. 4 is a schematic diagram of an example of an editing screen for forming a sequence pattern.

FIG. 5 is a schematic diagram of an example of input data.

DETAILED DESCRIPTION OF EXEMPLARY EMBODIMENTS

Hereinafter, exemplary embodiments of the present invention will be described in detail below with reference to the accompanying drawings such that those skilled in the art to which the present invention pertains can easily practice the present invention.

Figure 1:
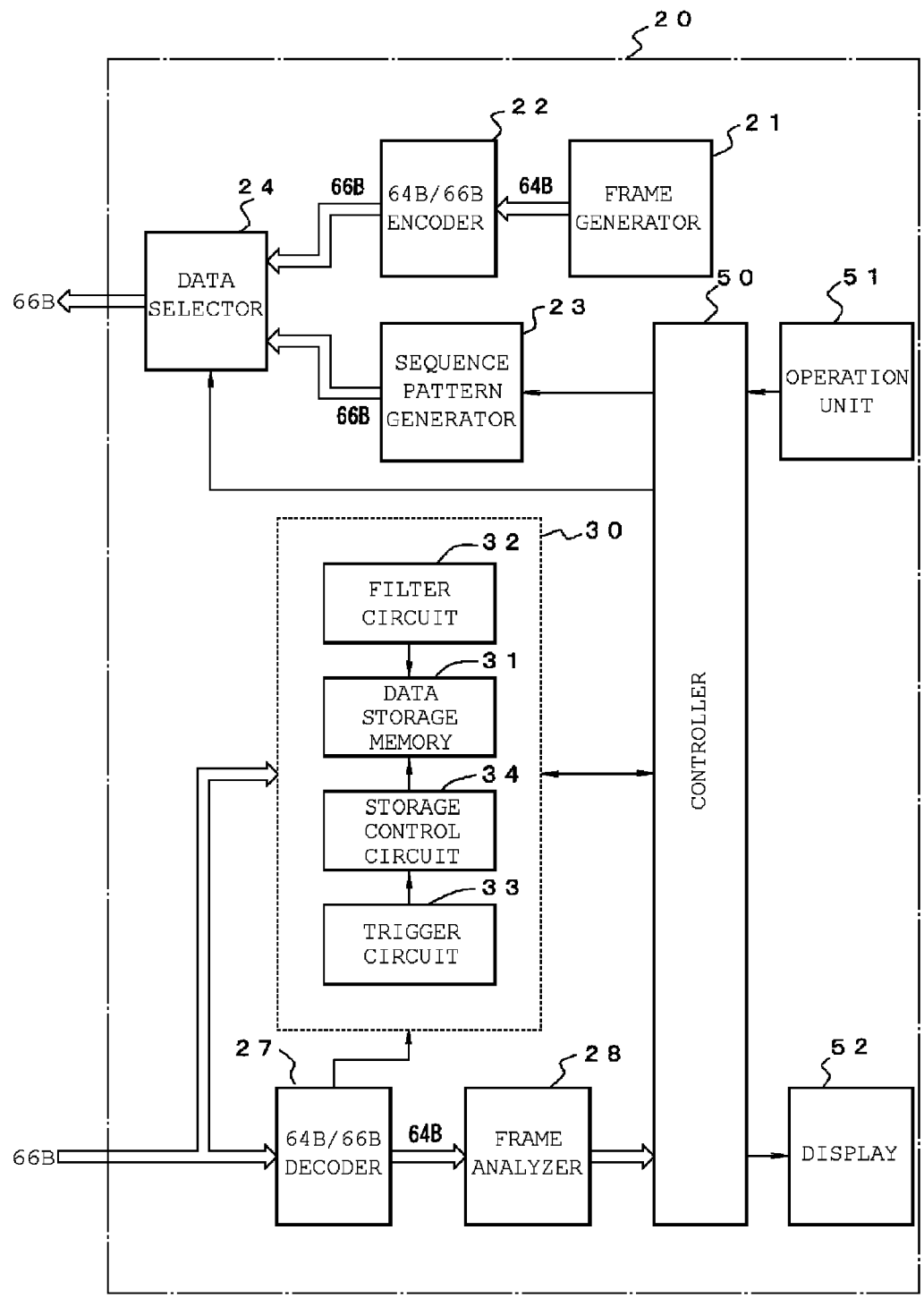
FIG. 1 is a schematic diagram of a test apparatus for a 64B/66B encoding process in accordance with an embodiment of the present invention.

FIG. 1 is shows the configuration of a test apparatus 20 for a 64B/66B encoding process in accordance with an embodiment of the present invention.

Referring to FIG. 1, a frame generator 21 generates frame data in a layer higher than a physical coding sublayer of Ethernet (registered trademark) and provides the frame data to a 64B/66B encoder 22.

The 64B/66B encoder 22 encodes the input frame data from 64B to 66B in a physical coding sublayer.

Meanwhile, FIG. 2 shows a 64B/66B block structure. The 66B block is generally divided into a block of a data block format including a synchronization header Sync of 2 bits (01) and eight data codes D of 8 bits, and a block of a control block format including a synchronization header of (10).

A block type field of 8 bits is located at the head of the block of the control block format, and a control code C, an order set O (link status information), a data code D, a start code S (packet head position), a terminate code T (packet end position) are combined and stored in an area of 56 bits. This code combination is designated by data in the block type field.

Meanwhile, a sequence pattern generator 23 generates a certain 66b sequence pattern written in advance and provides the 66b sequence pattern to a data selector 24.

The writing of the 66B sequence pattern in the sequence pattern generator 23 is performed by a controller 50 which will be described later.

The data selector 24 selectively outputs one of data encoded by the 64B/66B encoder 22 and a sequence pattern output from the sequence pattern generator 23 and provides the selected one to a test subject (for example, a 64B/66B decoder of a transmission apparatus or a communication apparatus).

The respective circuits constitute a transmitter of the test apparatus 20 for a 64B/66B encoding process, and the test apparatus 20 has a mode for encoding the frame data in the 66B data and providing the encoded data to the test subject and a mode for providing the 66B sequence pattern to the test subject and can perform the test by detecting the operation of the test subject with respect to the two modes.

Furthermore, the test apparatus 20 has a receiving function to perform monitoring and frame analysis of an external 66B data signal.

That is, the 64B/66B decoder 27 performs a decoding process and an error detection process on the externally input 66B data.

The 64B data of the Ethernet frame obtained by the decoding process is provided to a frame analyzer 28, by which an analysis process of the frame is performed.

A 66B data storage 30 stores 66B data, which satisfy a predetermined condition, among externally input 66B data.

Further, the controller 50 generates the 66B sequence pattern based on the 66B data stored in the 66B data storage 30 and writes the generated 66B sequence pattern in the sequence pattern generator 23.

Here, the 66B data storage 30 includes a data storage memory 31 for storing the 66B data, a filter circuit 32, a trigger circuit 33, and a storage control circuit 34.

The filter circuit 32 inputs data, which satisfy a predetermined pass condition, among externally input the 66B data to the data storage memory 31.

One of the pass conditions of the filter circuit 32 is to determine whether or not a pattern in a specific position of the data coincides with a predetermined pattern (pattern match or mismatch). Another pass condition is to determine whether or not there is an error (no matter in any case). The determination of the error is performed using an error detection signal from the 64B/66B decoder 27. Further, the condition for determining the pattern match/mismatch can be arbitrarily designated with respect to the synchronization header, the block type, the start code, the terminate code, etc.

Meanwhile, the trigger circuit 33 has the same configuration as the filter circuit 32 and provides a signal indicating the storage termination to the storage control circuit 34 when data satisfying a predetermined storage termination condition such as the pattern match or mismatch and the determination of the error with respect to each code.

The storage control circuit 34 receives a data storage instruction from the controller 50, sequentially stores data output from the filter circuit 32 in the data storage memory 31, receives a signal indicating the storage termination from the trigger circuit 33, terminates the storage of data in the data storage memory 31, and informs the controller 50 of the data storage termination. Meanwhile, although the process of storing the data in the data storage memory 31 is performed by the dedicated storage control circuit 34 in the above description, this process may be performed by the controller 50.

The controller 50 comprises a computer and is configured to form and write the sequence pattern, switch the data selector 24, designate the storage conditions of the 66B data storage 30, and display the analysis result of the frame analyzer 28 according to the operation of an operation unit 51 while displaying necessary information on a display 52.

Figure 3:
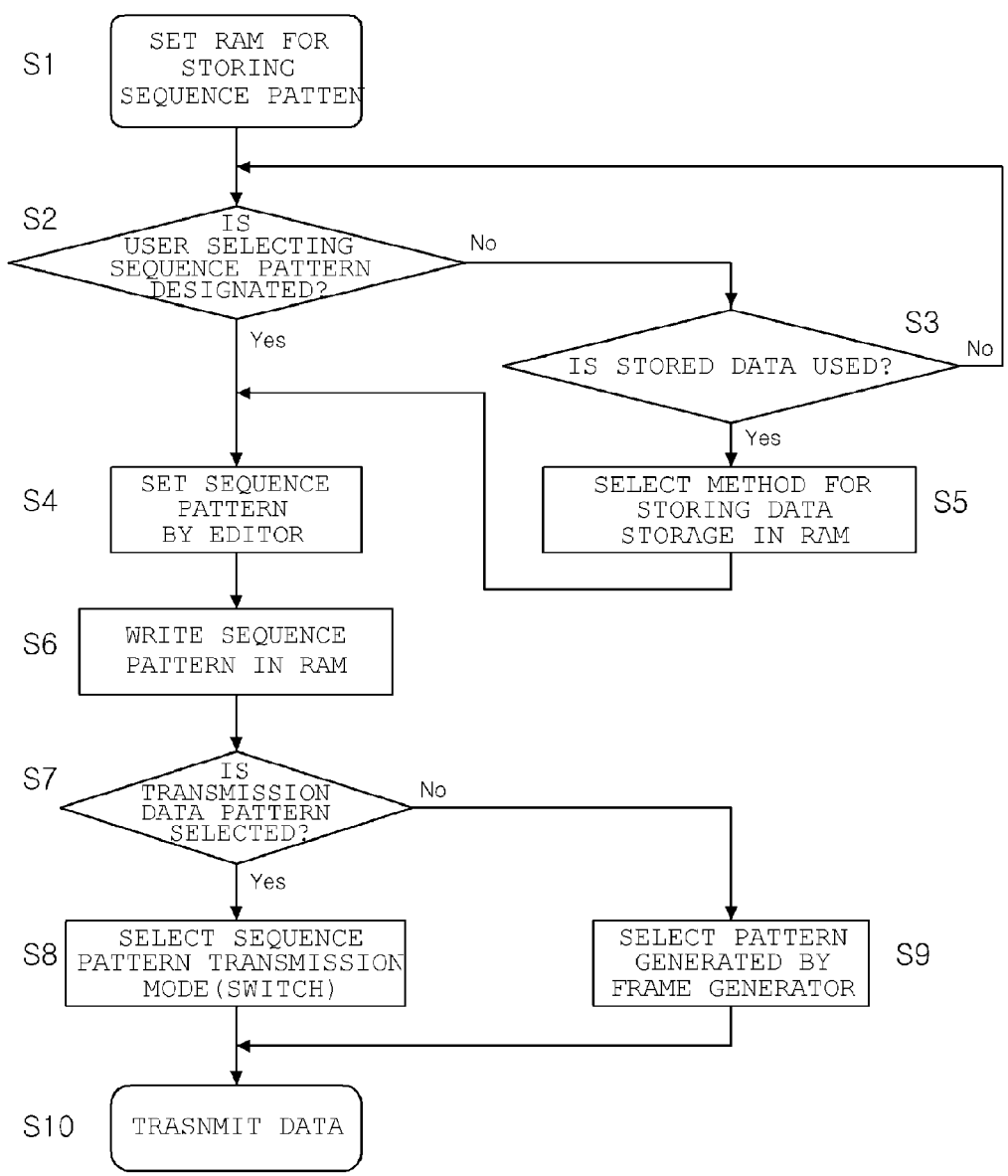
FIG. 3 is a flowchart illustrating a data transmission process.

FIG. 3 is a flowchart illustrating the operation of the controller 50 during transmission of data to the test subject, which will be described in detail below.

First, an internal memory area for storing a sequence pattern is secured (S1), and it is determined whether a user is designated (S2) and whether the 66B data stored in the 66B data storage 30 is used (S3).

When the user is designated, a screen as shown in FIG. 4, for example, in which a pattern can be formed and edited, is displayed on the display 52, and the 66B sequence pattern is input by the operation of the operation unit 51 (S4).

When it is determined that the 66B data stored in the 66B data storage 30 is used, a list of the 66B data stored in the data storage memory 31 of the 66B data storage 30 as shown in FIG. 5, for example, is displayed to select a certain 66B data among the 66B data (one and plural number) (S5). The selected 66B data is added to the editing screen as shown in FIG. 4.

After a desired sequence pattern is formed by the above-described process, the sequence pattern is written in the internal memory area (S6).

Next, the user selects a patterns of transmission data (S7), and when the sequence pattern is selected, the data selector 24 is connected to the sequence pattern generator 23, and the sequence pattern written in the internal memory is generated by the sequence pattern generator 23 (S8). When the frame data is selected, the data selector 24 is connected to the 64B/66B encoder 22, and the 66B data output from the 64B/66B encoder 22 is selected (S9) such that the data selected in the data selector 24 is transmitted (S10).

As such, since the pattern of the transmission data can be selected to a certain 66B sequence pattern, it is possible to test a special pattern which cannot be obtained from the pattern of the 66B data obtained by encoding the typical frame data, and it is also possible to reliably perform the test even in the event of an abnormal state in which a termination code is input to the RX-C state, for example, as mentioned above.

Figure 6:
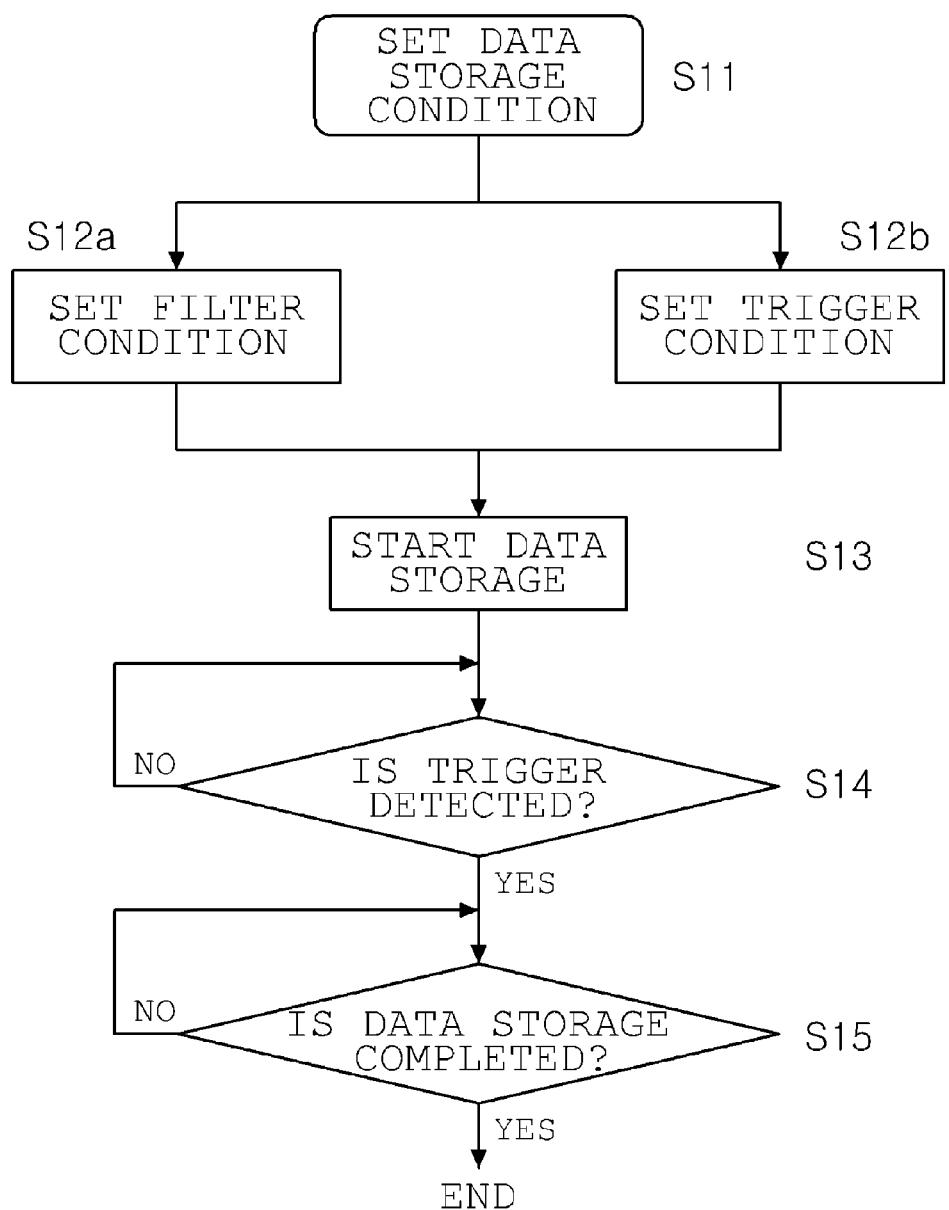
FIG. 6 is a flowchart illustrating a process of storing externally input 66B data.

Meanwhile, a data storage process, performed by the 66B data storage 30 when the 66B data is received through a line for the 66B data communication and monitored, is shown in FIG. 6.

That is, when it is required to set a data storage condition (S11), a mode for setting a filter condition (S12*a*) and a trigger condition (S12*b*) is established. When these conditions are set, a data storage process is performed by the 66B data storage 30 according to the corresponding condition (S13). When a trigger is detected (S14), the data storage is completed (S15).

Meanwhile, the data storage can be terminated in any way when the trigger is detected. For example, the data storage in the data storage memory 31 can be terminated when the data is written in the entire area of the data storage memory 31 after the trigger is detected, when the data is written in a half of the area of the data storage memory 31 after the trigger is detected, or immediately after the trigger is detected.

As such, since it is possible to store the data of a desired condition among the externally input 66B data and generate the 66B sequence pattern used for transmission based on the stored data, it is possible to facilitate the formation of the 66B sequence pattern, and further it is possible to simply generate a sequence pattern having 66B data with a desired condition when the storage condition is designated, thus efficiently performing the test.

For example, in the event of an abnormality in a terminal connected to a monitor circuit, the data input to the terminal can be selectively stored, and afterwards the data can be repeatedly provided to the terminal having the abnormality (disconnected from the network). As a result, it is possible to easily analyze the operation of the terminal with respect to the corresponding data.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A test apparatus for a 64B/66B encoding process, the apparatus comprising:
    a frame generator for generating frame data in a layer higher than a physical coding sublayer of Ethernet;
    a 64B/66B encoder for performing a 64B/66B encoding process of the frame data in the physical coding sublayer and generating encoded 66B data;
    a sequence pattern generator for generating a 66B sequence pattern;
    a data selector for selecting either the 66B data encoded by the 64B/66B encoder or the 66B sequence pattern output from the sequence pattern generator and providing the selected one to a test subject; and further
    comprising a 66B data storage for storing 66B data, which satisfy a predetermined condition, among externally input 66B data, wherein the controller generates the 66B sequence pattern based on the 66B data stored in the 66B data storage and writes the generated 66B sequence pattern in the sequence pattern generator.

2. The apparatus of claim 1, wherein the 66B data passes through a filter circuit having a predetermined pass condition, among the externally input 66B data.

3. The apparatus of claim 1 or 2, further comprising a 64B/66B decoder for decoding the externally input 66B data and detecting an error, wherein the 66B data storage stores the 66B data based on the result of the error detection performed by the 64B/66B decoder among the externally input 66B data.

4. The apparatus of any one of claim 1 or 2, wherein the 66B data storage determines whether or not the externally input 66B data satisfy a predetermined storage termination condition using a trigger circuit and terminates the storage of the 66B data based on the result of the determination.

5. The apparatus of claim 3, wherein the 66B data storage determines whether or not the externally input 66B data satisfy a predetermined storage termination condition using a trigger circuit and terminates the storage of the 66B data based on the result of the determination.

* * * * *